United States Patent [19]

Spence et al.

[11] Patent Number: 4,504,745
[45] Date of Patent: Mar. 12, 1985

[54] CLOCKED TRI-STATE DRIVER CIRCUIT

[75] Inventors: John R. Spence, Villa Park; Michael M. Yamamura, Cupertino, both of Calif.

[73] Assignee: Rockwell International Corporation, El Segundo, Calif.

[21] Appl. No.: 388,044

[22] Filed: Jun. 14, 1982

[51] Int. Cl.³ ................. H03K 19/096; H03K 17/693
[52] U.S. Cl. .................................... 307/473; 307/269; 307/270; 307/453; 307/481
[58] Field of Search ............... 307/443, 448, 450, 453, 307/468, 473, 475, 481, 482, 574, 575, 270, 577-578, 581-584, 269

[56] References Cited

U.S. PATENT DOCUMENTS

| 4,322,640 | 3/1982 | Fukushima et al. | 307/473 |
| 4,363,978 | 12/1982 | Heimbigner | 307/473 X |
| 4,379,241 | 4/1983 | Pumo | 307/269 X |
| 4,380,709 | 4/1983 | Au | 307/473 |

OTHER PUBLICATIONS

Homan, "FET Depletion Load Push-Pull Logical Circuit", IBM Tech. Disc. Bull., vol. 18, No. 3, Aug. 1975, pp. 910-911.

Primary Examiner—Stanley D. Miller
Assistant Examiner—D. R. Hudspeth
Attorney, Agent, or Firm—H. Fredrick Hamann; James F. Kirk

[57] ABSTRACT

A tri-state driver circuit is provided having a first clock node; and a second clock node, the first and second clock nodes being adapted to receive first and second clock signals from respectively first and second clock signal sources, the first clock signal being periodic and having a first and second logic level, the second clock signal being the complement of the first clock signal. A float node is included and is adapted to receive a complement float signal ($\overline{F}$) having a first and second logic level from a float signal source, an array of input nodes are also included, each input node being adapted to receive an input signal having a first and second logic level from a respective input signal source. An array of output nodes are included, each output node corresponding to a respective input node and being coupled to a respective load. The clocked tri-state driver circuit comprises: an enable node, a clocked power switch means coupled to the first and second clock signal nodes and the float node; the clocked power switch means being responsive to the first and second clock signal and the complement float signal first logic level for providing a clocked enable signal to the enable node; an array of driver circuit means for conditioning and transferring each respective input signal from a corresponding input node as an output signal to a corresponding output node when enabled, each respective driver circuit means being coupled to the enable node and enabled by the clocked enable signal, each respective driver circuit means being decoupled from the corresponding output node when not enabled, whereby the tri-state driver circuit operates to provide an array of output signals to an array of corresponding output nodes when enabled by the clocked enable signal first logic level at the enable node; the tri-state driver circuit also operating to decouple the output signals from the corresponding output nodes in response to the clocked enable signal second logic level thereby permitting the corresponding output nodes to be conditioned by voltage sources other than the tri-state driver circuit.

12 Claims, 5 Drawing Figures

FIG. 5

CLOCKED TRI-STATE DRIVER CIRCUIT

BACKGROUND OF THE INVENTION

1. Field of the Invention

This invention relates to integrated circuits, and particularly to metal oxide semiconductor large scale integrated circuit (MOS/LSI) devices having N-channel or P-channel MOS field effect transistors, such as are commonly used in hand calculators, home and office computers, automotive and industrial control systems and other commercial products. MOS/LSI devices use numerous circuit designs to achieve specific functions. One of the circuit designs used in MOS/LSI devices is a tri-state driver circuit, i.e., a circuit which has a first or logic one state, a second or logic zero state and a third or float state operation as output states, and which interfaces with and functions to drive output loads, external or internal to the MOS/LSI device, in response to low power signal sources within the MOS/LSI device. The circuit also functions to disconnect the tri-state driver circuit output from the output load when commanded to begin float state operation, in response to a complement float command.

The advantage that a tri-state driver circuit has over a two state driver circuit,(no float state) is that when the former circuit is commanded to the third or float state, no voltage is applied to the output load. The output of the circuit appears to be disconnected from the output load. The conductive paths to the output load are interrupted. The outputs of more than one tri-state driver circuit can therefor be connected to the same output load.

The principal advantage of this tri-state driver circuit is that it substantially reduces the internal power consumption of the circuit with no sacrifice in speed. This makes it possible to expand the number of circuits available in a given MOS/LSI device where the available power is limited.

2. Description of the Prior Art

Presently known tri-state driver circuits are usually comprised of: NOR gates; buffer switches for pulling up the output of the NOR gates; and an output driver stage that applies voltage to the output load. Such tri-state driver circuits dissipate the greatest amount of system power when in the float state, because the NOR circuits used in these tri-state driver circuits rely on a buffer switch to provide power to the output of the NOR gate. The buffer switches typically used in MOS/LSI devices employing a single voltage source can be made highly conductive or slightly conductive, but they cannot be cut off completely. With the output of the NOR circuit low, the respective buffer switch must drop the power supply voltage (VDD minus VSS), the power dissipated in the buffer switch remaining undesirably high because the switch continues to provide a small bias current although turned off.

Patents in the field of the invention include: U.S. Pat. No. 4,194,131, "TRISTATE LOGIC BUFFER CIRCUIT WITH ENHANCED DYNAMIC RESPONSE" and U.S. Pat. No. 4,194,132, "TRISTATE LOGIC BUFFER CIRCUIT WITH REDUCED POWER CONSUMPTION" both issued on Mar. 18, 1980 to Dale A. Marazek. Both of these patents differ substantially in topology from the present invention and neither teaches a method or means for reducing the power consumed in a tri-state driver circuit using MOS FET transistors.

Other Patents of interest include: U.S. Pat. No. 4,280,065, "TRI-STATE TYPE DRIVER CIRCUIT" issued on July 21, 1981 to Osamu Minato; U.S. Pat. No. 4,037,114, "TRI-STATE LOGIC CIRCUIT" issued on July 19, 1977 to Roger Green Stewart; and U.S. Pat. No. 3,906,255, "MOS CURRENT LIMITING OUTPUT CIRCUIT" issued on Sept. 16, 1975 to William David Mensch, Jr.

None of the above references require a two phase clock signal input such as is used by the invention tri-state driver circuit. None of the above referenced circuits employ a voltage dependent capacitor means operating in cooperation with a first and second switching means and a current limiting means as defined in FIG. 2 of the invention tri-state driver circuit. In addition, the referenced patents do not contemplate a two phase clock driven power switch for enabling an array of tri-state driver circuits means with an enable signal approximating a single supply voltage, VDD, during a particular clock phase interval.

Another reference of interest is U.S. patent application Ser. No. 174,089 filed July 31, 1980 and having as inventor Gary L. Heimbigner, and titled "REDUCED POWER TRISTATE DRIVER CIRCUIT". The Heimbigner circuit does not utilize a two phase clock signal nor does it incorporate a voltage dependent capacitive means operating in cooperation with a first and second switching means and a current limiting means to generate an enable signal. The Heimbigner reference requires complementary float signal inputs and does not envision a single float signal being used to control a power switch means to generate an enable signal for controlling an array of tri-state driver circuit means.

SUMMARY OF THE INVENTION

It is a major objective of this invention to substantially reduce the power dissipation in the buffer switches with NOR gates relative to the power dissipated in the buffer switches of the previously known tri-state driver circuits.

In addition, the tri-state driver circuit of the invention taught herein in accordance with another object of the invention, provides a means for controlling an array, of for example eight or sixteen, tri-state driver circuit means with a single complement float logic level.

Another object of this invention is to provide a tri-state driver circuit particularly suited to N-MOS or P-MOS LSI devices having a single power source or voltage level available.

It is a particular object of this invention to provide a tri-state driver circuit suitable for use with N-MOS or P-MOS circuits operating with a two phase or multi phase clock having non overlapping clock intervals.

It is a further objective of the invention to enable the designer of MOS/LSI circuits to use larger numbers of these circuits where the higher power required by previously known circuits would otherwise preclude such larger number use.

It is still another objective of the invention to achieve the foregoing in a circuit with essentially the same level of complexity, or with reduced complexity, as previous circuits and without a loss in circuit speed.

It is a highly particular objective of the invention to incorporate a clocked power switch means in a tri-state driver circuit to be responsive to a single complement float logic level and a two phase non overlapping clock signal to provide a single enable signal to an array of separate driver circuit means. Each driver circuit means is adapted to be responsive to a respective input signal and to provide a respective output signal to an output node. In the absence of an enable signal, each respective driver circuit means circuit in the array of driver circuit means remains in the float or uncoupled state with respect to its respective output node.

The enable signal to the enable node from the power switch means circuit is adapted to approach the voltage source level when commanded. The improved switch operation of the power switch means is provided by a single capacitive boost circuit within the power switch means circuit.

BRIEF DESCRIPTION OF THE DRAWINGS
The invention will be further described as to an illustrative embodiment in conjunction with the accompanying drawings in which.

DESCRIPTION OF THE PREFERRED EMBODIMENT

Figure 1:
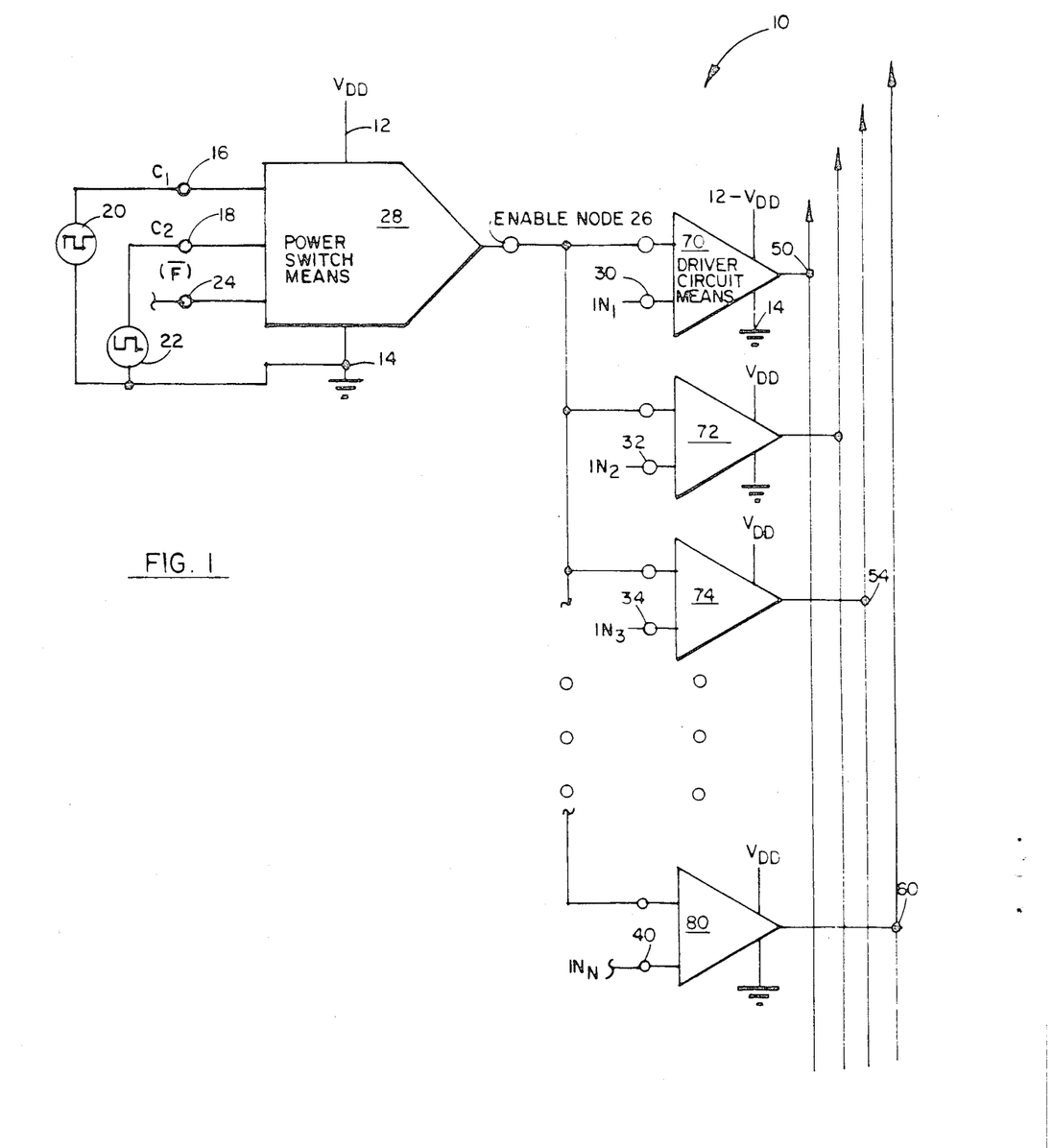
FIG. 1 is a block diagram of the invention clocked tri-state driver circuit.

Referring now to FIG. 1, the invention clocked tri-state driver circuit 10 is shown and is adapted to operate between a voltage source 12 and a reference potential 14, such as ground, and having a first clock node 16; and a second clock node 18. The first and second clock nodes are adapted to receive first and second clock signals from respectively first and second clock signal sources 20, 22. The first clock signal is periodic and has a first and second logic level. The second clock signal is the complement of the first clock signal.

A float node 24 is depicted and is adapted to receive a complement float signal ($\overline{F}$) having a first and second logic level from a float signal source. An array of input nodes 30, 32, 34, 40, each input node being adapted to receive an input signal having a first and second logic level from a respective input signal source (not shown), are depicted as is an array of output nodes 50, 52, 54, 60, each output node corresponding to a respective input node and being coupled to a respective load.

The invention clocked tri-state driver comprises: an enable node 26, a clocked power switch means 28 coupled to the first and second clocked signal nodes 16, 18 and the float node 24, the clocked power switch means being responsive to the first and second clocked signal and the complement float signal first logic level for providing a clocked enable signal to the enable node 26.

The invention clocked tri-state driver 10 further comprises: an array of driver circuit means 70, 72, 74, 80, for conditioning and transferring each respective input signal; such as $IN_1$, $IN_2$, $IN_3$ and $IN_N$ from a corresponding input node; such as 30, 32, 34 and 40 as an output signal to a corresponding output node; such as 50, 52, 54 and 60. Each respective driver circuit means 70, 72, 74 and 80 is decoupled from its corresponding output node 50, 52, 54 and 60 when not enabled.

The invention tri-state driver circuit 10 operates to provide an array of output signals to an array of corresponding output nodes 50, 52, 54 and 60 when enabled by the clocked enable signal first logic level at the enable node 26. The tri-state driver circuit also operates to decouple the output signals from the corresponding output nodes 50, 52, 54 and 60 in response to the clocked enable signal second logic level thereby permitting the corresponding output nodes 50, 52, 54 and 60 to be conditioned by voltage sources (not shown) other than the tri-state driver circuit 10.

Figure 2:
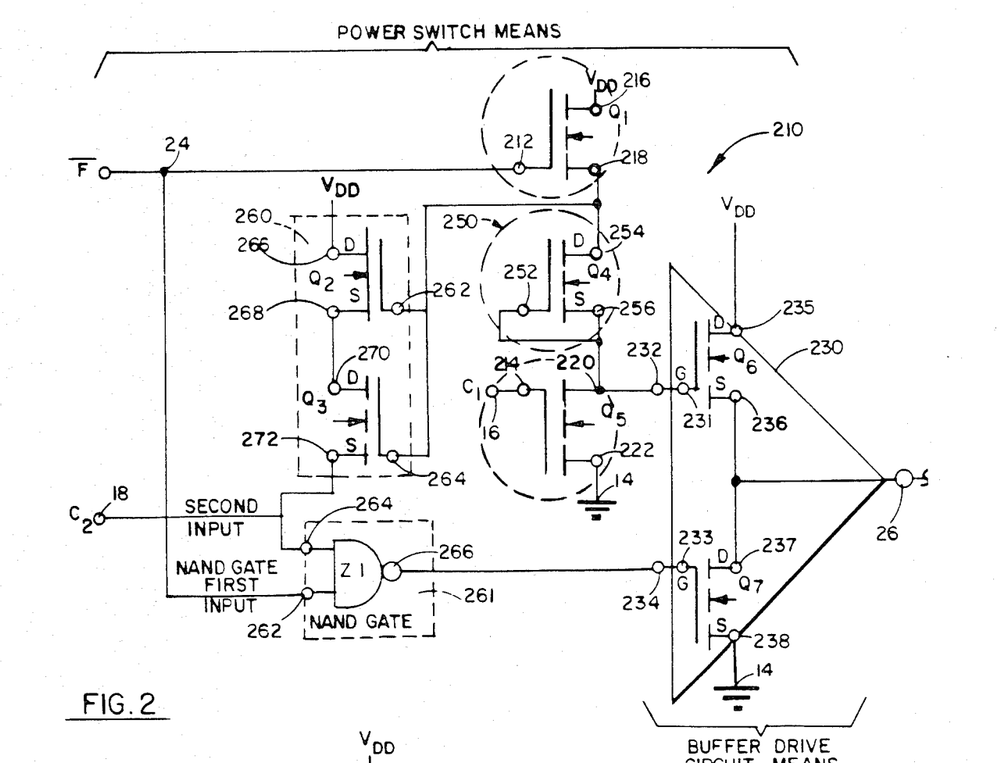
FIG. 2 is a schematic of an alternative embodiment of the clocked power switch means.

Referring now to FIG. 2, there is shown a particular embodiment of the clocked power switch means 210 comprising: a first and second switch means, as for example field effect transistors (FETs) Q1 and Q5. Each switch means has a control electrode 212, 214 and a conduction channel having a first and second terminal 216, 218; 220, 222. The first switch means Q1 conduction channel first terminal 216 is connected to the voltage source VDD. The second switch means Q5 conduction channel second terminal 222 is connected to the reference potential 14, ground. The second switch means control electrode 214 is connected to the first clock node 16.

A means for limiting current, such as Q4, is interposed between the first switch means conduction channel second terminal 218 and the second switch means conduction channel first terminal 220. Q4 is depicted as an n-channel depletion mode FET; however, other equivalent means such as diffused semiconductor resistors, discrete resistors, polysilicon resistors and J-FETs are envisioned as equivalents.

Buffer driver circuit means 230 for providing a clocked enable signal to the enable node 26 is shown. The buffer driver circuit means 230 has a first and second input terminal 232, 234, the buffer driver circuit means first input terminal 232 being connected to the second switch means conduction channel first terminal.

A voltage dependent capacitance means 260 is depicted for providing capacitance between the first switch means conduction channel second terminal 218 and the second clock node 18 concurrent with a relatively large voltage on the capacitance means; for example a voltage in excess of the threshold voltage of a FET used to construct the capacitance means.

The nand gate circuit means 261 provides a nand gate function having a first input 282 coupled to the float node 24 and to the first switch control grid 212. The nand electrode circuit means second input 284 is coupled to the second clock node 18. The nand gate circuit means output node 286 is coupled to the buffer driver circuit second input terminal 234.

The capacitance means 260 provides a boosted voltage level to the buffer driver circuit first input terminal 232 in response to the second clock signal first logic level at the second clock node 18, and a concurrent complement float signal ($\overline{F}$) first logic level at float node 24. The complement float signal first logic level and the second clock signal first logic level thereby cooperate to increase the signal voltage applied to the buffer driver circuit first input terminal 232 to a value in excess of the voltage source VDD.

The means for limiting current 250 further comprises: a fourth multiterminal semiconductor device, such as Q4, having a control electrode 252 and a conduction channel having a first and second terminal 254, 256, the conduction channel first terminal being connected to the first switch means conduction channel second terminal 218, the control electrode being connected to the conduction channel second terminal and to the second switch means conduction channel first terminal 222. The fourth multiterminal semiconductor device is thereby adapted to limit current to the second switch means conduction channel.

The voltage dependent capacitance means 260 further comprises: a second and third multiterminal semiconductor device, such as Q2 and Q3; each multiterminal semiconductor device having a control electrode 262, 264 and a conduction channel having a first and second terminal 266, 268; 270, 272. The second and third multiterminal semiconductor device control electrode 262, 264 are connected together and to the first switch means conduction channel second terminal 218. The second multiterminal semiconductor device conduction channel second terminal 268 is connected to the third multiterminal semiconductor device conduction channel first terminal 270. The third multiterminal semiconductor device conduction channel second terminal 272 is connected to the second clock node 18.

The third multiterminal semiconductor device conduction channel becomes conductive only as the control electrode voltage exceeds a predetermined device dependent threshold, Vth. The third multiterminal semiconductor device, Q3 operates to couple the second multiterminal semiconductor device, Q2, as a capacitor between the second switch means conduction channel second terminal 218 and the third multiterminal semiconductor device conduction channel first terminal 270.

The buffer driver circuit means 230 further comprises: a sixth and seventh multiterminal semiconductor device, Q6, Q7. Each multiterminal semiconductor device has a control electrode 231, 233 and a conduction channel having a first and second terminal 235, 236; 237, 238. The sixth multiterminal semiconductor device conduction channel first terminal 235 is connected to the voltage source VDD. The sixth multiterminal semiconductor device conduction channel second terminal 236 is connected to the seventh multiterminal semiconductor device conduction channel first terminal 237 and to the enable node 26. The seventh multiterminal semiconductor device conduction channel second terminal 238 is connected to the reference potential 14, ground. The seventh multiterminal semiconductor device control electrode 233 is connected to the second buffer driver input terminal 234, and the sixth multiterminal semiconductor device control grid is connected to the first buffer driver input terminal 232.

The buffer driver circuit is adapted to provide a first logic level signal to the enable node 26 in response to a first logic level signal to the first buffer driver input terminal 232 concurrent with a second logic level to the second buffer driver input terminal 234. The buffer driver circuit is further adapted to provide a second logic level to the enable node 26 in response to a second logic level signal to the first buffer driver input terminal 232 concurrent with a first logic level signal to the second buffer driver input terminal 234.

The first and second switch means are depicted in FIG. 2 as a first and fifth multiterminal semiconductor device such as N-channel enhancement mode FETs Q1 and Q5. Each of these FETs has a conduction channel having a first and second terminal, typically a drain and source; and, a control electrode typically a gate. The first multiterminal semiconductor device conduction channel first terminal, typically the drain of Q1 is connected to the voltage source VDD. The Q1 source is connected to the first switch means conduction channel second terminal 218, the Q1 gate is connected to the first switch means control electrode 212.

The second switch means further comprises: the fifth multiterminal semiconductor device, N-channel enhancement mode FET Q5, having a conduction channel first terminal, such as its drain, connected to the second switch means conduction channel 220, the Q5 conduction channel second terminal, typically its source, is connected to the second switch means conduction channel second terminal 222. The control electrode, typically its gate is connected to the second switch means control grid 214.

In response to a first logic level signal, such as a plus five volt logic level, at the float node 24, Q1 becomes conductive providing charging current to the voltage dependent capacitance means 260 concurrent with a second clock signal logic level at the second clock node 18, such as zero volts or ground. The fifth multiterminal semiconductor device, Q5 provides a conduction path to discharge the charge on the capacitance means 260 concurrent with a float signal having a second logic level, such as ground, and a first clock signal at the first clock node, 16 having a first logic level, such as plus five volts.

Figure 3:
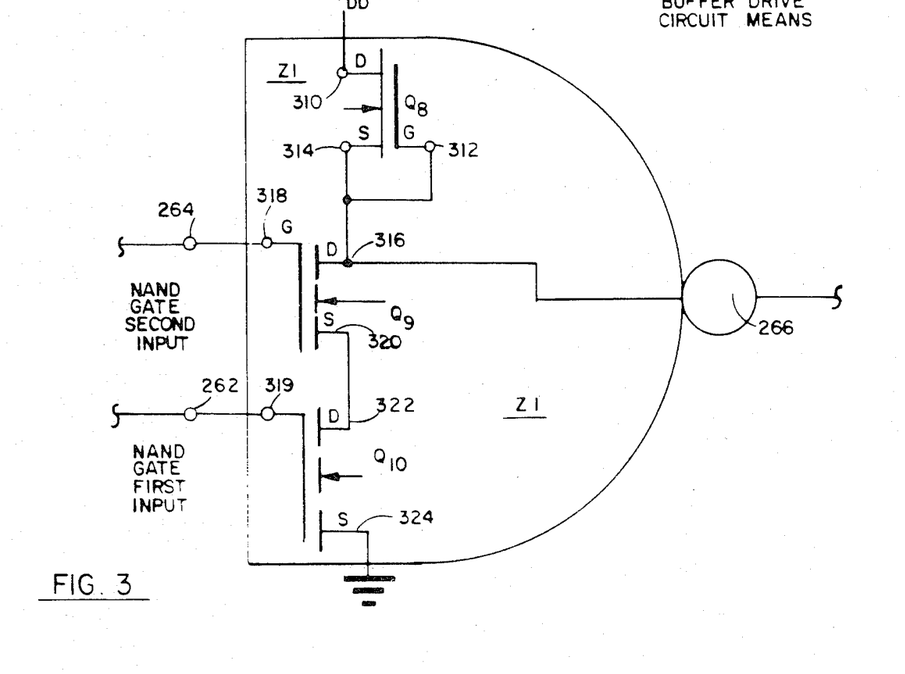
FIG. 3 is a schematic of an alternative embodiment of the nand gate circuit means, Z1.

Referring now to FIG. 3, nand gate Z1 is depicted comprising an eighth, ninth and tenth multiterminal semiconductor device, such as N-channel depletion mode FET Q8 and N-channel enhancement mode FETs Q9 and Q10, each device having a control electrtode and a conduction channel having a first and second terminal, such as a drain and source. The eighth multiterminal semiconductor device conduction channel first terminal, a drain 310 is connected to the voltage source VDD. The QB control grid 312 is connected to the Q8 source 314, to the Q9 drain 316 and to the nand gate Z1 output 266.

The ninth multiterminal semiconductor device, Q9, has a control grid, gate 318 connected to the nand gate second input 264. The ninth multiterminal semiconductor device conduction channel second terminal, source 320 is connected to the tenth multiterminal semiconductor device conduction channel first terminal drain 322. The tenth multiterminal semiconductor device control electrode, gate 319, is connected to the nand gate first input 282. The tenth multiterminal semiconductor device second terminal, source 324 is connected to the reference potential, ground. The nand gate Z1 is adapted to provide a second logic level, such as zero volts, at the nand gate output node 266 in response to concurrent first logic level signals, such as plus five volts, at the nand gate first and second input 282, 284.

Figure 4:
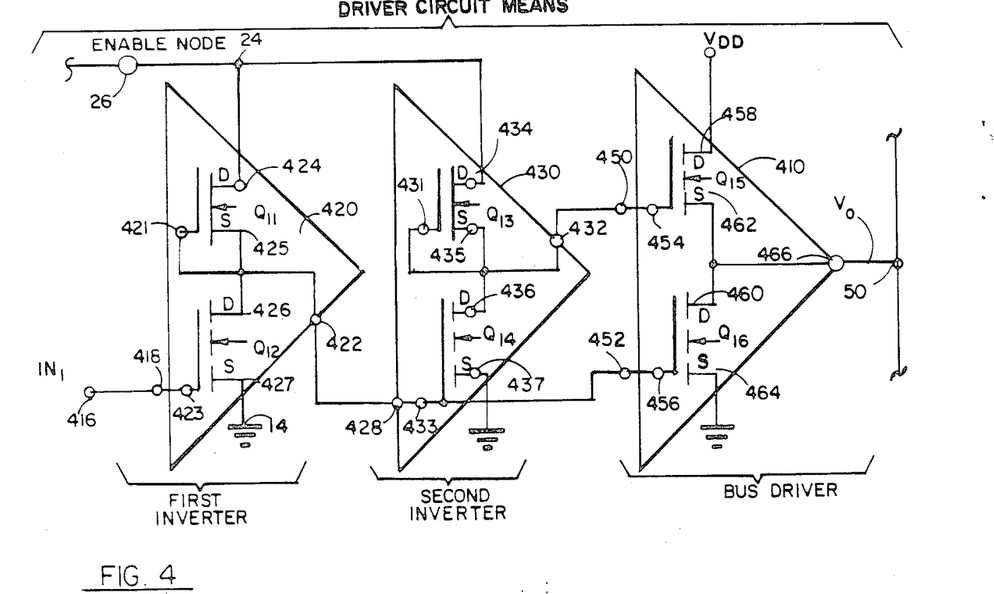
FIG. 4 is a schematic of an alternative embodiment of a particular driver circuit means.

Referring now to FIG. 4, a particular embodiment of a driver circuit means is depicted as including a respective bus driver circuit 410 having a first and second input and an output coupled to the respective driver output circuit means output node 50, the respective bus driver circuit 410 being adapted to provide an output signal having a first logic level, such as plus five volts, to the respective output node 50 in response to an input signal having a first logic level, such as plus five volts, to the first bus driver circuit first input 450 and a concurrent complementary input signal to the respective bus driver circuit second input 452.

The respective bus driver circuit is further adapted to decouple the respective output signal from the respective bus driver circuit output 50 in response to simultaneous input signals having a second logic level, such as ground, to the respective bus driver first and second inputs 450, 452.

Each respective driver circuit means 70, 72, 74, 80 further comprises a first and second inverter circuit 420, 430. The first inverter circuit 420 has an input, 418 and an output 422, the input 418 being coupled to the respective driver circuit means input node 416.

The second inverter circuit 430 is depicted as having an input 428 and an output 432, the input 428 being connected to the first inverter circuit output 422 and to the respective bus driver circuit second input 452. The output 432 is connected to the second respective bus driver circuit first input 450. The first and second inverter circuits are coupled to the enable node 26 and are further adapted to provide respective complementary output signals, at their respective outputs 422, 432, in response to the enable signal at the enable node 26 having a first logic level, such as plus five volts. The first and second inverter circuits are also adapted to provide simultaneous outputs at their respective outputs 422, 432, having a second logic level, such as ground, in response to the enable signal at the enable node 26 having a second logic level, such as ground. Simultaneous outputs of zero volts from inverter outputs 422 and 432 to respective bus driver circuit inputs 452 and 450 condition the respective bus driver circuit to decouple the respective output signal from the respective output node, such as 50, in response to the simultaneous input signals from the first and second inverter circuits 420, 430 having a second logic level, such as zero volts.

The respective bus driver circuit 410 further comprises a fifteenth and sixteenth multiterminal semiconductor device such as N-channel enhancement mode FETs Q15 and Q16, each FET device having a control electrode, such as gates 454 and 456, and a conduction channel having a first and second terminal, such as drains 458 and 460 and sources 462 and 464. The fifteenth multiterminal semiconductor device control electrode 454 is connected to the bus driver circuit first input, and the conduction channel first terminal, drain 458 is connected to the voltage source, VDD. The Q15 source is connected to the bus driver circuit output 466.

The Q16 control electrode, or gate 456, is connected to the bus driver circuit second input 452. The Q16 conduction channel first terminal, or drain 460, is connected to the bus driver circuit output 466. The Q16 conduction channel second terminal, or source 464 is connected to the reference potential.

The first inverter circuit 420 further comprises an eleventh and twelfth multiterminal semiconductor device, such as N-channel depletion mode FET Q11 and N-channel enhancement FET Q12, each respective multiterminal semiconductor device having a control electrode, or gate 421, 423 and a conduction channel having a first terminal or drain 424, 426 and a second terminal, or source 425, 427. The eleventh multiterminal semiconductor device conduction channel first terminal, drain 424 is connected to the enable node 26 and the second terminal, source 425, is connected to the Q11 control electrode, or gate 421 and to the first inverter circuit output 422.

The twelfth multiterminal semiconductor device control electrode, gate 423, is connected to the first inverter circuit input 418. The Q12 conduction channel first terminal, or drain 426 is connected to the first inverter circuit output 422 and the Q12 source is connected to the reference potential, or ground 14.

The second inverter circuit 430 further comprises a thirteenth and fourteenth multiterminal semiconductor device, such as N-channel depletion mode FET Q13 and N-channel enhancement mode FET Q14. Each respective multiterminal semiconductor device has a control electrode, or gate such as 431 and 433. Each respective conduction channel has a first terminal, such as drain 434 and 436. Each respective multiterminal semiconductor device has a conduction channel second terminal, such as source 435 and 437.

The Q13 drain 434 is connected to the enable node 26. The Q13 source 435 is connected to the Q13 gate 431 and to the second inverter circuit output 432.

The Q14 drain 436 is connected to the second inverter output 432 and the Q14 source 437 is connected to the reference potential. The Q14 control electrode, or gate 433, is connected to the second inverter circuit input 428.

Figure 5:
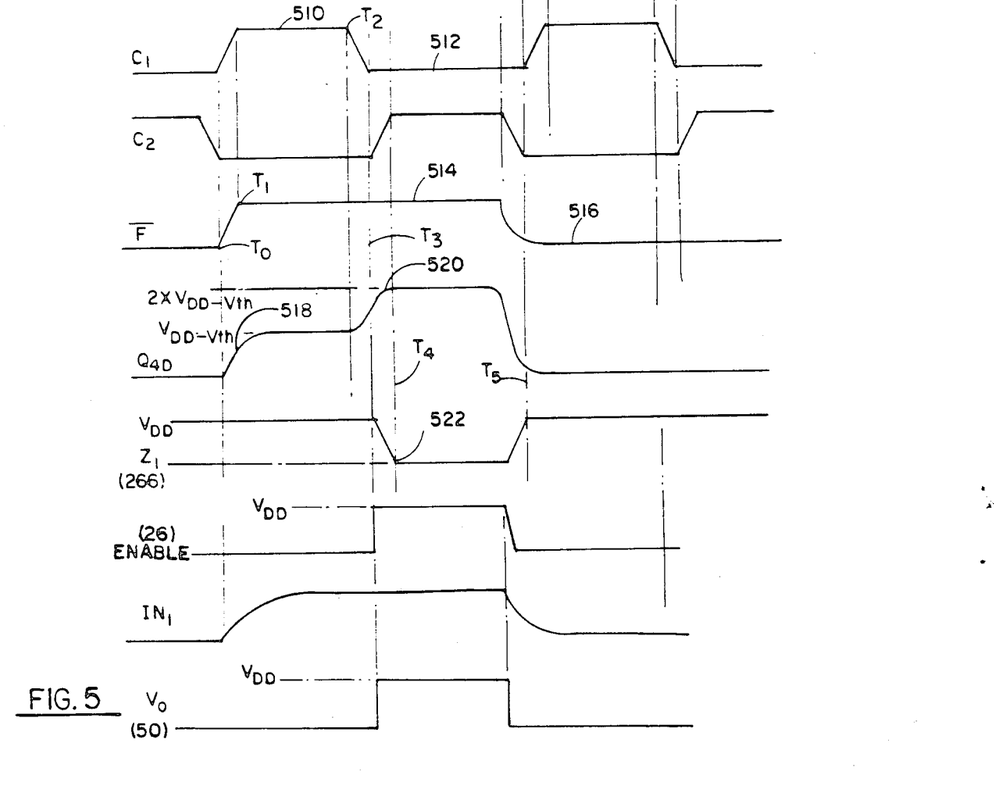
FIG. 5 depicts typical timing waveform relationships.

Referring now to FIG. 5, first clock signal, C1, is provided to first clock node 16 from a first clock signal source, the first clock signal being periodic and having a first and second logic level 510, 512. The second clock signal is typically provided by a second clock signal source to second clock node 18. The second clock signal, as shown in FIG. 5, is the complement of the first clock signal.

The complement float signal ($\overline{F}$) is provided to float node 24 from an external complement float signal source. The complement float signal shown in FIG. 4 also has a first and second logic level 514, 516; the first logic level 514 typically being a positive voltage with respect to the second logic level 516 for N-MOS LSI circuitry as depicted in FIGS. 2, 3 and 4.

The complement float signal at float node 24 rises from a second logic level of typiclly zero volts at $T_0$ to a first logic level of typically plus five volts at $T_1$ driving FET Q1 into conduction. Clock signal $C_1$ concurrently applied to first clock node 16 and to the gate 214 of Q5 drives Q5 into conduction during the $T_1$ to $T_2$ interval. FET Q4 is an N-channel depletion mode FET. Q4 operates as a current limiting device or a resistive element between the FET Q1 source 218 and the FET Q5 drain 220. The resistance of the Q4 FET is controlled by the process and the length to width ratio of the FET device. With the Q1 and Q5 FETs being concurrently driven into conduction by first logic levels concurrently being applied to their respective gates 212, 214, the FET Q4 drain 254 rises to a positive voltage approaching VDD $-$Vth as depicted by the FIG. 5 $Q4_D$ time dependent voltage curve at 518. The rise in voltage is approximately exponential and is dependent on the conductivity of the conduction channel of FET Q1 and the capacitance provided by FET Q2. As the $Q4_D$ voltage rises, FET Q3 gate 264 exceeds the VTH of FET Q3. The FET Q3 source 272 is connected to the second clock node 18 and is held at a second logic level, or voltage of approximately zero volts during the $T_O$ to $T_3$ interval. As the gate to source voltage of FET Q3 exceeds the $V_{th}$ of the device, FET Q3 switches ON and connects the FET Q2 source 268 to the second logic level potential of approximately zero volts. FET Q2 is configured to have a relatively large gate to channel capacitance by controlling the length to width ratio, dielectric thickness and the size of the gate. The relative capacitance of FET Q2 increases as the voltage difference between FET Q2 gate 62 and FET Q2 source 268 increases.

Between $T_2$ and $T_3$, clock $C_1$ changes from a first logic level to a second logic level at the FET Q5 gate 214 driving the FET Q5 into cutoff. Between $T_3$ and $T_4$, second clock signal, $C_2$, changes from a second logic level to a relatively positive first logic level, at second clock node 18 and the FET Q3 source 272. Throughout this interval, FET Q3 remains highly conductive, having a relatively small voltage difference between its drain 270 and source 272. FET Q3 thereby couples the voltage rise at the second clock node 18 directly to the FET Q2 source 268. As the FET Q2 source 268 rises positively, the charge on FET Q2 couples the rise in voltage to the FET Q2 gate 262 and correspondingly to the FET Q1 source 218 to a potential more positive than FET Q1 gate 212. As the FET Q1 source is driven positive with respect to the FET Q1 gate 212, FET Q1 is driven into cutoff and the voltage at the FET Q1 source 218 is driven positive with respect to the voltage source VDD. Since FET Q5 is already in cutoff, no discharge path exists for the FET Q2 operating as a voltage dependent capacitive means.

With FET Q5 in cutoff, no current path exists for discharge current through FET Q4. As a result, no voltage is dropped across FET Q4 during this interval. The voltage at the FET Q4 source 256 is approximately equal to the voltage at the FET Q4 drain 254 and correspondingly to the voltage at the FET Q2 gate 262 and the FET Q1 source 218. The voltage at the FET Q4 source 256 is therefore driven to exceed the voltage source level VDD during the interval $T_2$ to $T_3$ and approaches two times the VDD $-$Vth value as depicted in FIG. 5 at 520.

As the second clock signal, $C_2$, reaches a first logic level at nand gate second input 284, concurrently with a first logic level input from $(\bar{F})$ at nand gate first input 282, the voltage at the nand gate circuit means output node 286 drops to a second logic level 522. In this embodiment, the Z1 output node 286 is connected to the FET Q7 gate 233. A second logic level voltage applied to the FET Q7 gate 233 forces FET Q7 into cutoff during the interval from $T_4$ to $T_5$.

With FET Q7 in cutoff and with a voltage at the FET Q6 gate 231 equal to approximately two times the voltage source VDD, Q6 is driven hard into conduction at T4. FET Q6 operates as a relatively perfect switch connecting the enable node 26 to the voltage source VDD. The size of FET Q6 and correspondingly Q7 is adjusted to drive the capacitive load typically connected to enable node 26.

FET Q7 gate 233 remains at a first logic level, a relatively positive value with respect to ground, at all times until $(\bar{F})$ assumes a first logic level at node 24 concurrently with the second clock signal assuming a first logic level at second clock node 18. FET Q7 thereby clamps the enable node 26 to reference potential 14 or ground. Referring to FIG. 4, a ground on the enable node 26 operates to ground the FET Q11 and FET Q13 drains 424, 434. FET Q11 and FET Q13 are N-channel depletion mode FETs having their respective gates 421, 431 connected to their respective sources 425, 445. These FETs are bilateral devices. Both FET Q11 and FET Q13 thereby provide respective conductive paths from their respective sources 425, 435 to the grounded enable node 26 during all periods other than the T4 to T5 interval. The conductive paths provided by FETs Q11 and Q13 to the enable node 26 serves to ground the FET Q14 gate 433 and the FET Q16 gate 456 cutting off each of these respective FETs. The corresponding ground at the FET Q13 source 435 grounds the FET Q15 gate cutting off FET Q15. With FET Q15 and FET Q16 both cut off, output node 50 is effectively decoupled from the bus driver output 466. thereby, enabling other sources to drive the output node 50.

With enable node 26 grounded, input signals to the respective input signal node, for example IN1 at 416 will not result in power dissipation in the respective first or second inverter circuits since no power is applied to these circuits other than the power delivered via the input node 416 to the FET Q12 gate 423. Power is dissipated in the respective driver circuit means only during the interval that an enable voltage having a first logic level is present at enable node 26. FIG. 5 illustrates the voltage provided to the enable node 26. The $IN_1$ input signal to input node 416 is also illustrated in FIG. 5 along with the respective output signal from the driver circuit means to the output node 50. A circuit for obtaining a nand gate circuit means Z1 appears in FIG. 3. N-channel depletion mode FET Q6 operates as a current limiting means or a resistive means for supplying current to FET Q9 drain 316. By driving both FET Q9 and FET Q10 into conduction, the FET Q9 drain 316 is connected to ground. If either FET Q9 or FET Q10 is cut off, the voltage at the FET Q9 drain 316 remains high. A nand gate function requires that both inputs be high or true, or as in the case at hand, a first logic level to result in a low at the nand gate means output 286. Both FET Q9 and FET Q10 are n-channel enhancement mode field effect transistors that become conductive when their respective gates, 318 and 319, are driven positive with respect to their respective sources 320, 324.

It is clear that the invention circuit can be fabricated using a negative voltage source and P-MOS circuitry where a first logic level is a negative voltage with respect to the second logic level.

There is thus provided a clocked tri-state driver circuit particularly useful in the design of MOS/LSI devices. The above described embodiments of this invention circuit are merely descriptive of the circuit principles and are not to be considered limiting. The scope of this invention instead shall be determined from the scope of the following claims including their equivalents.

What is claimed is:

1. A clocked tri-state driver circuit characterized by being operable between a voltage source and a reference potential, such as ground, and having a first clock node; and a second clock mode, said first and second clock nodes for receiving first and second clock signals from respectively first and second clock signal sources, said first clock signal being periodic and having a first and second logic level, said second clock signal being the complement of said first clock signal, a float node for receiving a complement float signal $(\bar{F})$ having a first and second logic level from a float signal source, an array of input nodes, each input node for receiving an input signal having a first and second logic level from a respective input signal source, an array of output nodes, each output node corresponding to a respective input node and being coupled to a respective load, said clocked tri-state driver comprising:

an enable node, a clocked power switch means powered by said voltage source with respect to said reference potential and coupled to said first and second clock nodes and said float node, said clocked power switch means being responsive to said first and second clock signal and said complement float signal first logic level for providing a clocked enable signal to said enable node, an array of driver circuit means for conditioning and transferring each respective input signal from a corresponding input node as an output signal to a corresponding output node when enabled, each respective driver circuit means being powered by said voltage source with respect to said reference potential and coupled to said enable node and enabled by said clocked enable signal, each respective driver circuit means being decoupled from said corresponding output node when not enabled, whereby, said tri-state driver circuit operates to provide an array of output signals to an array of corresponding output nodes when enabled by said clocked enable signal first logic level at said enable node, said tri-state driver circuit also operating to decouple said output signals from said corresponding output nodes in response to said clocked enable signal second logic level thereby permitting said corresponding output nodes to be conditioned by voltage sources other than said tri-state driver circuit.

2. The combination of claim 1, wherein clocked power switch means further comprises:

a first and second switch means, each said switch means having a control electrode and a conduction channel having a first and second terminal, said first switch means conduction channel first terminal being connected to said voltage source, said second switch means conduction channel second terminal being connected to said reference potential, said second switch means control electrode being connected to said first clock node, means for limiting current, said means for limiting current being coupled between said first switch means conduction channel second terminal and said second switch means conduction channel first terminal, a buffer driver circuit means for providing said clocked enable signal to said enable node, said buffer driver circuit means being powered by said voltage source with respect to said reference potential and having a first and second input terminal, said buffer driver circuit means first input terminal being connected to said second switch means conduction channel first terminal, voltage dependent capacitance means for providing capacitance between said first switch means conduction channel second terminal and said second clock node concurrent with a relatively large voltage on said capacitance means, a NAND gate circuit means for providing a NAND gate function having a first input coupled to said float node and to said first switch means control electrode, a second input coupled to said second clock node and an output node coupled to said buffer driver circuit second input terminal, whereby, said capacitance means provides a boosted voltage level to said buffer driver circuit first input terminal in response to said second clock signal first logic level, said complement float signal first logic level and said second clock signal first logic level and said second clock signal first logic level cooperate to provide a signal voltage at said buffer driver circuit first input terminal in excess of said voltage source.

3. The combination of claim 2, wherein said buffer driver circuit means further comprises:

a first and second buffer driver circuit multiterminal semiconductor device (Q6, Q7), each buffer driver circuit multiterminal semiconductor device having a control electrode and a conduction channel having a first and second terminal, said first buffer driver circuit multiterminal semiconductor device conduction channel first terminal being connected to said voltage source, said first buffer driver circuit multiterminal semiconductor device conduction channel second terminal being connected to said second buffer driver circuit multiterminal semiconductor device conduction channel first terminal and to said enable node, said second buffer driver circuit multiterminal semiconductor device conduction channel second terminal being connected to said reference potential, said second buffer driver circuit multiterminal semiconductor device control electrode being connected to said second buffer driver input terminal, said first buffer driver circuit multiterminal semiconductor device control electrode being connected to said first buffer driver input terminal;

whereby, said buffer driver circuit is characterized to provide a first logic level signal to said enable node in response to a first logic level signal to said first buffer driver input terminal concurrent with a second level signal to said second buffer driver input terminal; said buffer driver circuit being further characterized to provide a second logic level to said enable node in response to a second logic level signal to said first buffer driver input terminal concurrent with a first logic level signal to said second buffer driver input terminal.

4. The combination of claim 2, wherein said first and second switch means further comprises:

a first and second switch means multiterminal semiconductor device (Q1, Q5), each said switch means multiterminal semiconductor device having a control electrode and a conduction channel having a first and second terminal, said first switch means multiterminal semiconductor device conduction channel first terminal being connected to said voltage source, said first switch means multiterminal semiconductor device conduction channel second terminal being connected to said first switch means conduction channel second terminal, said first switch means multiterminal semiconductor device control electrode being connected to said NAND gate first input, said second switch means multiterminal semiconductor device conduction channel first terminal being connected to said second switch means multiterminal semiconductor device conduction channel first terminal, said second switch means multiterminal semiconductor device conduction channel second terminal being connected to said second switch means multiterminal semiconductor device conduction channel second terminal, said second switch means multiterminal semiconductor device control electrode being connected to said second switch means multiterminal semiconductor device control electrode;

whereby, in response to a first logic level signal at said float node, said first switch means multiterminal semiconductor device becomes conductive providing charging current to said voltage dependent capacitance means concurrent with a second clock signal second logic level, and said second switch means multiterminal semiconductor device provides a conduction path to discharge said capacitance means concurrent with a float signal having a second logic level and a first clock signal having a first logic level.

5. The combination of claim 2, wherein said NAND gate further comprises:

an first, second and third NAND gate multiterminal semiconductor device, each said NAND gate multiterminal semiconductor device having a control electrode and a conduction channel having a first and second terminal, said first NAND gate multiterminal semiconductor device conduction channel first terminal being connected to said voltage source, said first NAND gate multiterminal semiconductor device control electrode being connected to said first NAND gate multiterminal semiconductor device conduction channel second terminal and to said NAND gate output node and to said second NAND gate multiterminal semiconductor device conduction channel first terminal, said second NAND gate multiterminal semiconductor device control electrode being connected to said NAND gate second input, said second NAND gate multiterminal semiconductor device conduction channel second terminal being connected to said third NAND gate multiterminal semiconductor device conduction channel first terminal, said third NAND gate multiterminal semiconductor device control electrode being connected to said NAND gate first input, said third NAND gate multiterminal semiconductor device second terminal being connected to said reference potential;

whereby, said NAND gate is characterized to provide a second logic level signal at said NAND gate output node in response to concurrent first logic level signals at said NAND gate first and second inputs.

6. The combination of claim 1, wherein each respective driver circuit means further comprises:

a respective bus driver circuit having a first and second input and an output coupled to said respective driver circuit means output node, said respective bus driver circuit being characterized to provide an output signal having a first logic level to said respective output node in response to an input signal having a first logic level to said first bus driver circuit first input and a concurrent complementary input signal to said respective bus driver circuit second input, said respective bus driver circuit being further characterized to decouple said respective output signal from said respective bus driver circuit output in response to simultaneous input signals having a second logic level to said respective bus driver circuit first and second inputs;

each said respective driver circuit means further comprising a first and second inverter circuit, said first inverter circuit having an input and an output, said input being coupled to said respective driver circuit means input node, said second inverter circuit having an input and an output, said input being connected to said first inverter circuit output and to said respective bus driver circuit second input, said output being connected to said bus driver circuit first input, said first and second invertter circuits being coupled to said enable node and being further characterized to provide respective complementary output signals in response to said enable signal having a first logic level, and simultaneous outputs having a second logic level in response to said enable signal having a second logic level;

whereby, said respective bus driver circuit decouples said respective output signal from said respective output node in response to said simultaneous input signals from said first and second inverter circuits having a second logic level.

7. The combination of claim 6, wherein said respective bus driver circuit further comprises:

a first and second bus driver multiterminal semiconductor device (Q15, Q16), each multiterminal semiconductor device having a control electrode and a conduction channel having a first and second terminal, said first bus driver multiterminal semiconductor device control electrode being connected to said bus driver circuit first input, said first bus driver multiterminal semiconductor device conduction channel first terminal being connected to said voltage source and said second terminal being connected to said bus driver circuit output, said second bus driver multiterminal semiconductor device control electrode being connected to said bus driver circuit second input, said second bus driver multiterminal semiconductor device conduction channel first terminal being connected to said bus driver circuit output and said second terminal being connected to said reference potential.

8. The combination of claim 6, wherein said first inverter circuit further comprises a first and second first-inverter circuit multiterminal semiconductor device (Q11, Q12), each respective multiterminal semiconductor device having a control electrode and a conduction channel having a first and second terminal, said first first-inverter circuit multiterminal semiconductor device conduction channel first terminal being connected to said voltage source and said second terminal being connected to said control electrode and to said first-inverter circuit output, said second first-inverter circuit multiterminal semiconductor device control electrode being connected to said first-inverter circuit input, said second first-inverter circuit multiterminal semiconductor device conduction channel first terminal being connected to said first-inverter circuit output and said second terminal being connected to said reference potential, said second-inverter circuit further comprising a first and second second-inverter circuit multiterminal semiconductor device (Q13, Q14), each respective multiterminal semiconductor device having a control electrode and a conduction channel having a first and second terminal, said first second-inverter circuit multiterminal semiconductor device conduction channel first terminal being connected to said enable node and said second terminal being connected to said control electrode and to said second-inverter circuit output, said second second-inverter circuit multiterminal semiconductor device conduction channel first terminal being connected to said second-inverter circuit output and said second terminal being connected to said reference potential, said second second-inverter circuit multiterminal semiconductor device control electrode being connected to said second-inverter circuit input.

9. The combination of claim 6, wherein said voltage source has a relatively positive potential with respect to said reference potential, and wherein each said first logic level is relatively positive with respect to said second logic level, and wherein said multiterminal semiconductor devices are N-channel field effect transistors.

10. The combination of claim 6, wherein said voltage source has a relatively negative potential with respect to the reference potential, and wherein each said first logic level is a relatively negative level with respect to said second logic level, and wherein said multiterminal semiconductor devices are P-channel field effect transistors.

11. The combination of claim 2 wherein said means for limiting current further comprises:

a current limiting multiterminal semiconductor device (Q4) having a control electrode and a conduction channel having a first and second terminal, said conduction channel first terminal being connected to said first switch means conduction channel second terminal, said control electrode being connected to said conduction channel second terminal and to said second switch means conduction channel first terminal;

whereby, said current limiting multiterminal semiconductor device is characterized as limiting current to said second switch means conduction channel.

12. The combination of claim 2, wherein said voltage dependent capacitance means further comprises:

a first and second capacitance means multiterminal semiconductor device (Q2, Q3), each capacitance means multiterminal semiconductor device having a control electrode and a conduction channel having a first and second terminal, said first and second capacitance means multiterminal semiconductor device control electrodes being connected together and to said first switch means conduction channel second terminal, said first capacitance means multiterminal semiconductor device conduction channel second terminal being connected to said second capacitance mean multiterminal semiconductor device conduction channel first terminal, said second capacitance means multiterminal semiconductor device conduction channel second terminal being connected to said second clock node;

whereby, said second capacitance means multiterminal semiconductor device conduction channel becomes conductive only as said control electrode voltage exceeds a predetermined device dependent threshold, said second capacitance means multiterminal semiconductor device operating to couple said first capacitance means multiterminal semiconductor device as a capacitor between said second switch means conduction channel second terminal and said second capacitance means multiterminal semiconductor device conduction channel first terminal.

* * * * *

UNITED STATES PATENT AND TRADEMARK OFFICE
CERTIFICATE OF CORRECTION

PATENT NO. : 4,504,745
DATED : March 12, 1985
INVENTOR(S) : JOHN R. SPENCE et al It is certified that error appears in the above-identified patent and that said Letters Patent are hereby corrected as shown below:

Column 4, line 46 change "grid" to "electrode"

Column 4, line 47 change "electrode" to "gate"

Column 6, line 9 change "secgnd" to "second"

Column 6, line 31 change "electrtode" to "electrode"

Column 8, line 15 change "437-" to "437"

Column 8, line 67 change "62" to "262"

Column 10, line 51 change "mode" to "node"

Signed and Sealed this

Eighteenth Day of March 1986

[SEAL]

Attest:

DONALD J. QUIGG

Attesting Officer

Commissioner of Patents and Trademarks